US010991798B2

(12) United States Patent
Xu et al.

(10) Patent No.: US 10,991,798 B2
(45) Date of Patent: Apr. 27, 2021

(54) REPLACEMENT SACRIFICIAL NANOSHEETS HAVING IMPROVED ETCH SELECTIVITY

(71) Applicant: International Business Machines Corporation, Armonk, NY (US)

(72) Inventors: Wenyu Xu, Albany, NY (US); Chen Zhang, Albany, NY (US); Kangguo Cheng, Schenectady, NY (US); Xin Miao, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/252,768

(22) Filed: Jan. 21, 2019

(65) Prior Publication Data

US 2020/0235206 A1     Jul. 23, 2020

(51) Int. Cl.
*H01L 29/00* (2006.01)
*H01L 29/06* (2006.01)
*H01L 29/10* (2006.01)
*H01L 21/306* (2006.01)
*H01L 29/08* (2006.01)
*H01L 29/66* (2006.01)
*H01L 21/02* (2006.01)
*H01L 21/308* (2006.01)
*H01L 29/423* (2006.01)

(52) U.S. Cl.
CPC .... *H01L 29/0673* (2013.01); *H01L 21/02532* (2013.01); *H01L 21/3081* (2013.01); *H01L 21/30604* (2013.01); *H01L 29/0847* (2013.01); *H01L 29/1037* (2013.01); *H01L 29/42392* (2013.01); *H01L 29/6656* (2013.01); *H01L 29/66545* (2013.01); *H01L 29/66553* (2013.01); *H01L 21/0262* (2013.01)

(58) Field of Classification Search
CPC ............... H01L 29/775; H01L 21/764
See application file for complete search history.

(56) References Cited

U.S. PATENT DOCUMENTS 9,082,551 B2  7/2015  Osada et al.
9,085,551 B2  7/2015  Li et al.
(Continued)

OTHER PUBLICATIONS

Anonymous, "Nanosheet Dielectric Isolation through Self-Aligned Directional Process," IPCOM000253327D, Mar. 2018, 8 pages.

*Primary Examiner* — Caridad Everhart
*Assistant Examiner* — Ankush K Singal
(74) *Attorney, Agent, or Firm* — Cantor Colburn LLP; Douglas Pearson

(57) ABSTRACT

Embodiments of the invention are directed to a method of forming a nanosheet transistor. A non-limiting example of the method includes forming a nanosheet stack having alternating layers of channel nanosheets and sacrificial nanosheets, wherein each of the layers of channel nanosheets includes a first type of semiconductor material, and wherein each of the layers of sacrificial nanosheets includes a second type of semiconductor material. The layers of sacrificial nanosheets are removed from the nanosheet stack, and layers of replacement sacrificial nanosheets are formed in the spaces that were occupied by the sacrificial nanosheets. Each of the layers of replacement sacrificial nanosheets includes a first type of non-semiconductor material.

20 Claims, 7 Drawing Sheets

(56) References Cited

U.S. PATENT DOCUMENTS

| | | |
|---|---|---|
| 9,362,355 B1 | 6/2016 | Cheng et al. |
| 9,741,792 B2 | 8/2017 | Cheng et al. |
| 9,905,672 B2 | 2/2018 | Wang et al. |
| 9,947,593 B2 | 4/2018 | Doris et al. |
| 10,008,583 B1 | 6/2018 | Rodder et al. |
| 10,243,061 B1 * | 3/2019 | Cheng ............... H01L 29/66772 |
| 2014/0036410 A1 | 2/2014 | Okamoto et al. |
| 2016/0071729 A1 | 3/2016 | Hatcher et al. |
| 2017/0053998 A1 * | 2/2017 | Kim ..................... H01L 21/764 |
| 2018/0047832 A1 * | 2/2018 | Tapily ................ H01L 29/7833 |
| 2018/0122900 A1 | 5/2018 | Cheng et al. |
| 2018/0197785 A1 | 7/2018 | Cheng et al. |
| 2018/0197794 A1 | 7/2018 | Kang et al. |
| 2019/0189769 A1 * | 6/2019 | Basker ................ H01L 29/0653 |
| 2020/0098893 A1 | 3/2020 | Guillorn et al. |

\* cited by examiner

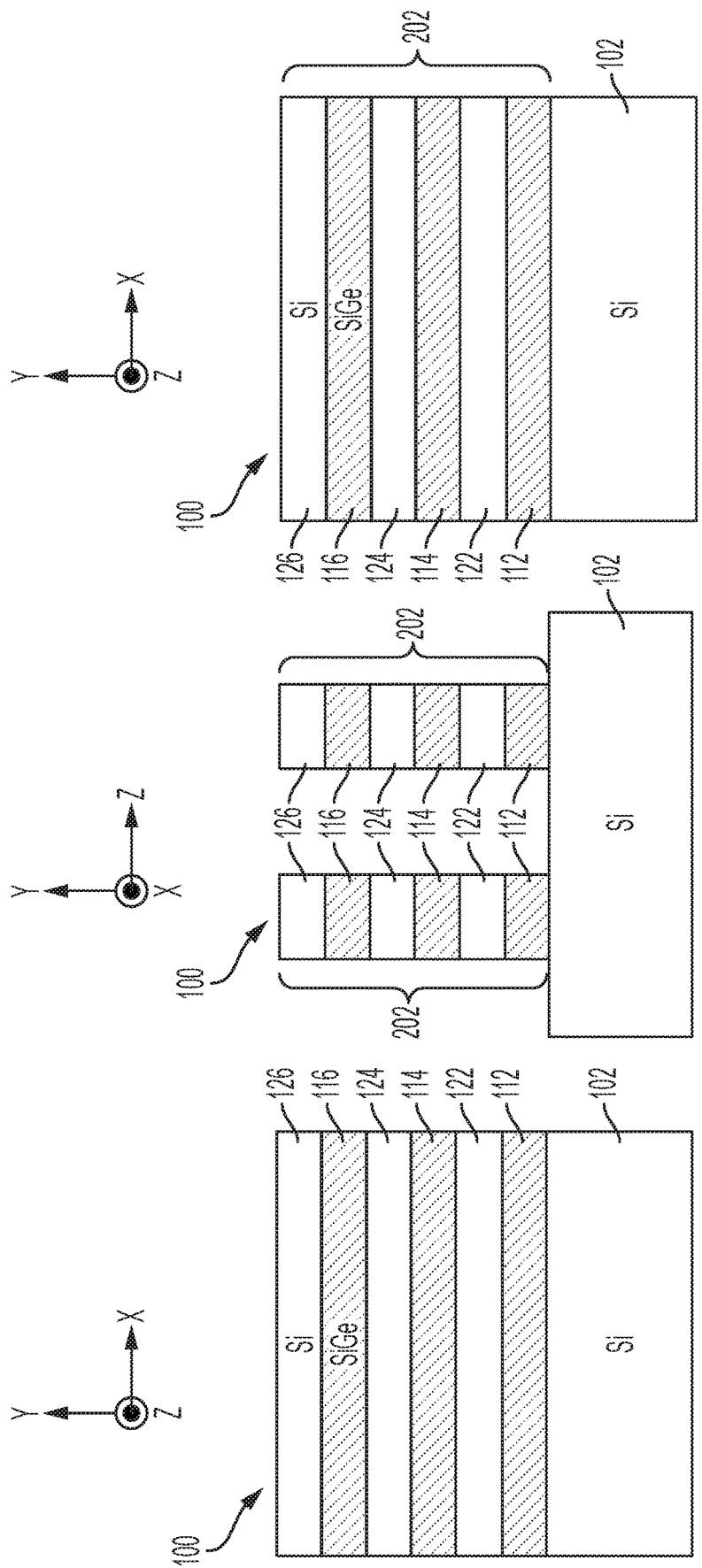

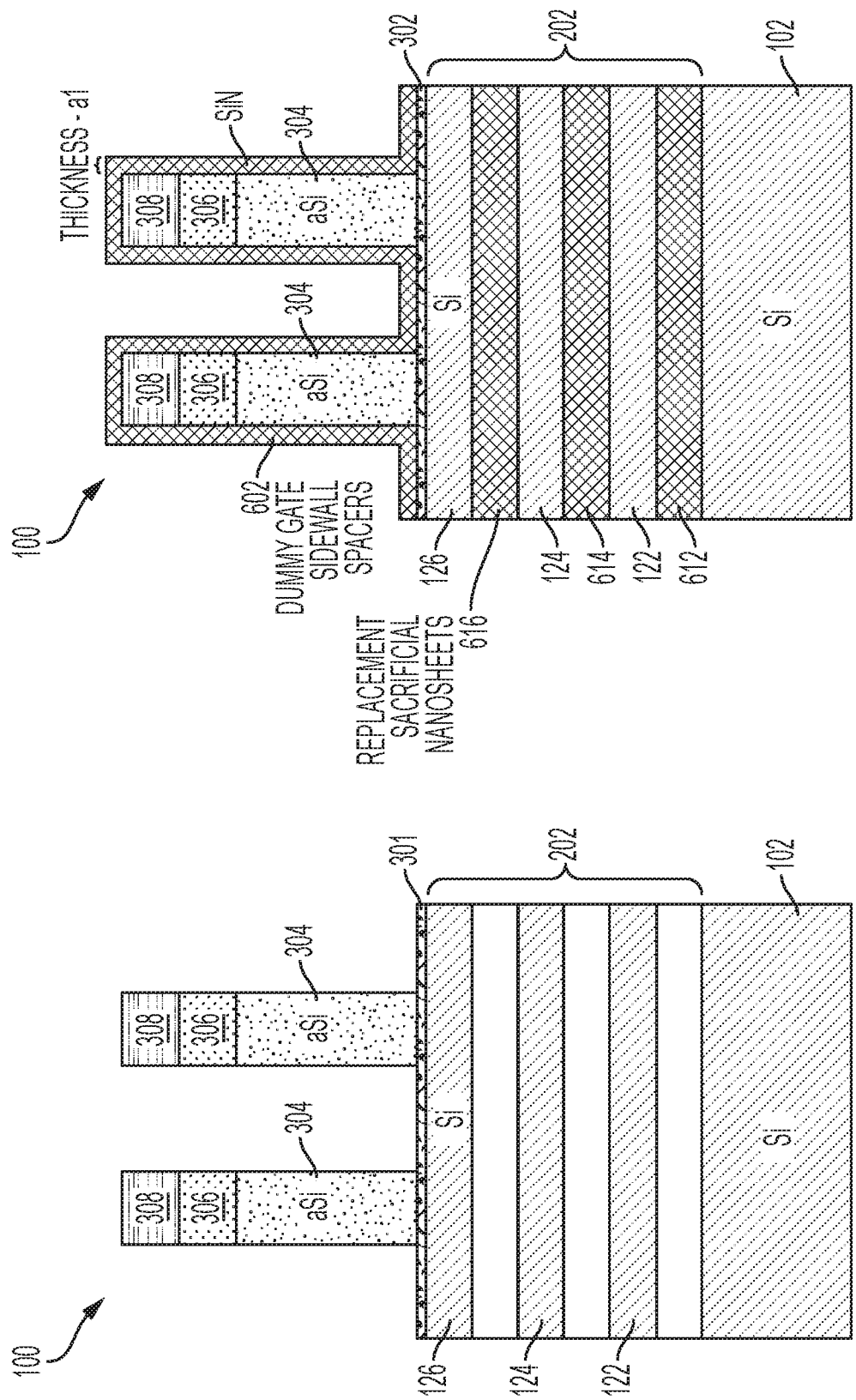

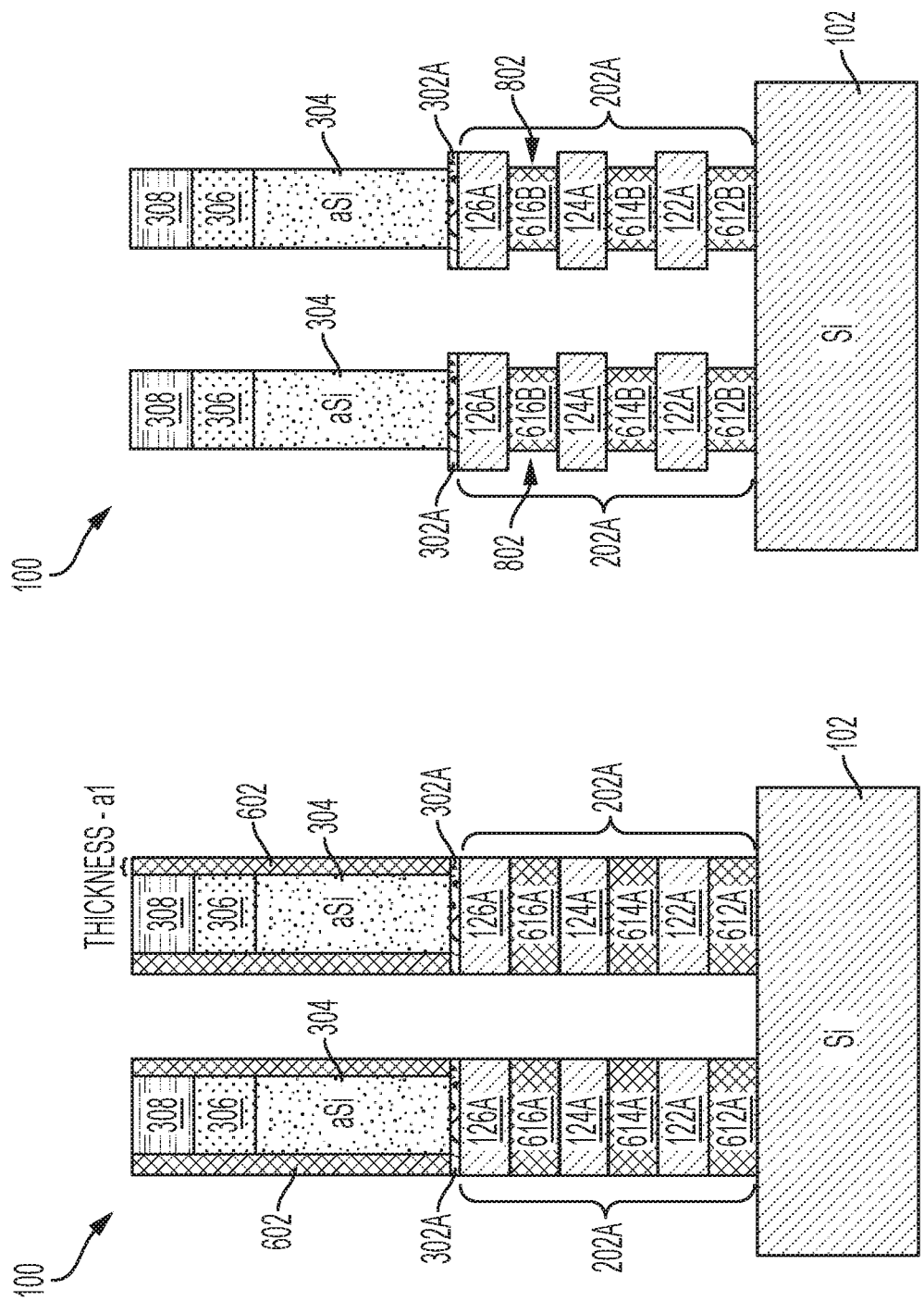

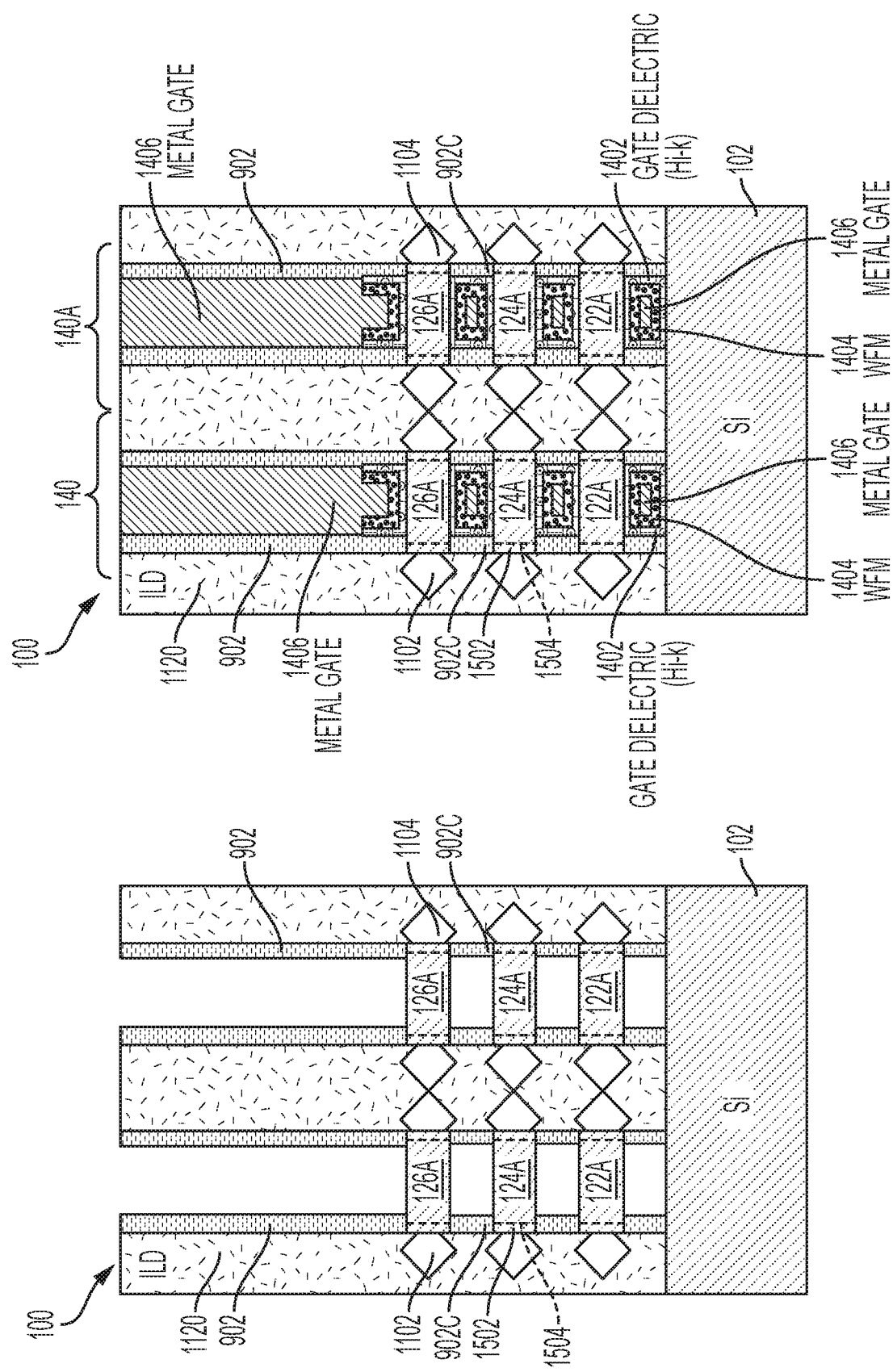

REPLACEMENT SACRIFICIAL NANOSHEETS HAVING IMPROVED ETCH SELECTIVITY

BACKGROUND

The present invention relates in general to fabrication methods and resulting structures for semiconductor devices. More specifically, the present invention relates to fabrication methods and resulting structures for forming nanosheet transistors that include replacement sacrificial nanosheets having improved etch selectivity with respect to at least the source or drain regions of the transistor.

In contemporary semiconductor device fabrication processes, a large number of semiconductor devices, such as silicon channel n-type field effect transistors (nFETs) and silicon germanium channel p-type field effect transistors (pFETs), are fabricated on a single wafer. Non-planar transistor device architectures, such as nanosheet (or nanowire) transistors, can provide increased channel density and performance over planar transistors. Nanosheet transistors, in contrast to conventional planar FETs, include a gate stack that wraps around the full perimeter of multiple nanosheet channel regions for improved control of channel current flow. Nanosheet transistor configurations enable fuller depletion in the nanosheet channel regions and reduce short-channel effects.

SUMMARY

Embodiments of the invention are directed to a method of forming a nanosheet transistor. A non-limiting example of the method includes forming a nanosheet stack having alternating layers of channel nanosheets and sacrificial nanosheets, wherein each of the layers of channel nanosheets includes a first type of semiconductor material, and wherein each of the layers of sacrificial nanosheets includes a second type of semiconductor material. The layers of sacrificial nanosheets are removed from the nanosheet stack, and layers of replacement sacrificial nanosheets are formed in the spaces that were occupied by the sacrificial nanosheets. Each of the layers of replacement sacrificial nanosheets includes a first type of non-semiconductor material.

Embodiments of the invention are directed to a method of forming a nanosheet transistor. A non-limiting example of the method includes forming a nanosheet stack having alternating layers of channel nanosheets and sacrificial nanosheets, wherein each of the layers of channel nanosheets includes a first type of semiconductor material, and wherein each of the layers of sacrificial nanosheets includes a second type of semiconductor material. The layers of sacrificial nanosheets are removed from the nanosheet stack, and layers of replacement sacrificial nanosheets are formed in spaces that were occupied by the sacrificial nanosheets. Each of the layers of replacement sacrificial nanosheets includes a first type of non-semiconductor material. Source or drain (S/D) regions are communicatively coupled to ends of the layers of channel nanosheets. An etch medium is applied, wherein the etch medium is configured to remove the layers of replacement nanosheets from the nanosheet stack. The S/D regions include the first type of semiconductor material or the second type of semiconductor material. The first type of semiconductor material has a first etch rate in response to the etch medium. The second type of semiconductor material has a second etch rate in response to the etch medium. The first type of non-semiconductor material has a third etch rate in response to the etch medium. The third etch rate is greater than the second etch rate, and the third etch rate is greater than the first etch rate.

Embodiments of the invention are directed to a method of forming a nanosheet transistor. A non-limiting example of the method includes forming a nanosheet stack having alternating layers of channel nanosheets and sacrificial nanosheets, wherein each of the layers of channel nanosheets includes a first type of semiconductor material, and wherein each of the layers of sacrificial nanosheets includes a second type of semiconductor material. Gate sidewall spacers are formed over and around the nanosheet stack. The layers of sacrificial nanosheets are removed from the nanosheet stack, and layers of replacement sacrificial nanosheets are formed in the spaces that were occupied by the sacrificial nanosheets. Inner spacers are formed adjacent to ends of each of the layers of replacement sacrificial nanosheets. Each of the layers of replacement sacrificial nanosheets includes a first type of non-semiconductor material. Each of the gate sidewalls includes a second type of non-semiconductor material. Each of the inner spacers includes a third type of non-semiconductor material.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

FIGS. 1-14 depict cross-sectional views of a section of a substrate/wafer after various fabrication operations to form nanosheet transistors thereon, wherein the nanosheet transistors include replacement sacrificial nanosheets having improved etch selectivity in accordance with aspects of the invention, in which:

FIG. 1 depicts a cross-sectional view of a semiconductor structure after initial fabrication stages according to embodiments of the invention;

FIG. 2A depicts a cross-sectional, across-the-fin view of the semiconductor structure after fabrication stages according to embodiments of the invention;

FIG. 2B depicts a cross-sectional, across-the-gate view of the semiconductor structure shown in FIG. 2A, wherein the across-the-gate view results from rotating the across-the-fin view 90 degrees counterclockwise into the page;

FIG. 3 depicts a cross-sectional, across-the gate view of the semiconductor structure after fabrication stages according to embodiments of the invention;

FIG. 4 depicts a cross-sectional, across-the gate view of the semiconductor structure after fabrication stages according to embodiments of the invention;

FIG. 5 depicts a cross-sectional, across-the gate view of the semiconductor structure after fabrication stages according to embodiments of the invention;

FIG. 6 depicts a cross-sectional, across-the gate view of the semiconductor structure after fabrication stages according to embodiments of the invention;

FIG. 7 depicts a cross-sectional, across-the gate view of the semiconductor structure after fabrication stages according to embodiments of the invention;

FIG. 8 depicts a cross-sectional, across-the gate view of the semiconductor structure after fabrication stages according to embodiments of the invention;

FIG. 9 depicts a cross-sectional, across-the gate view of the semiconductor structure after fabrication stages according to embodiments of the invention;

FIG. 10 depicts a cross-sectional, across-the gate view of the semiconductor structure after fabrication stages according to embodiments of the invention;

FIG. 11 depicts a cross-sectional, across-the gate view of the semiconductor structure after fabrication stages according to embodiments of the invention;

FIG. 12 depicts a cross-sectional, across-the gate view of the semiconductor structure after fabrication stages according to embodiments of the invention;

FIG. 13 depicts a cross-sectional, across-the gate view of the semiconductor structure after fabrication stages according to embodiments of the invention; and FIG. 14 depicts a cross-sectional, across-the gate view of the semiconductor structure after fabrication stages according to embodiments of the invention.

Figures 3, 4:
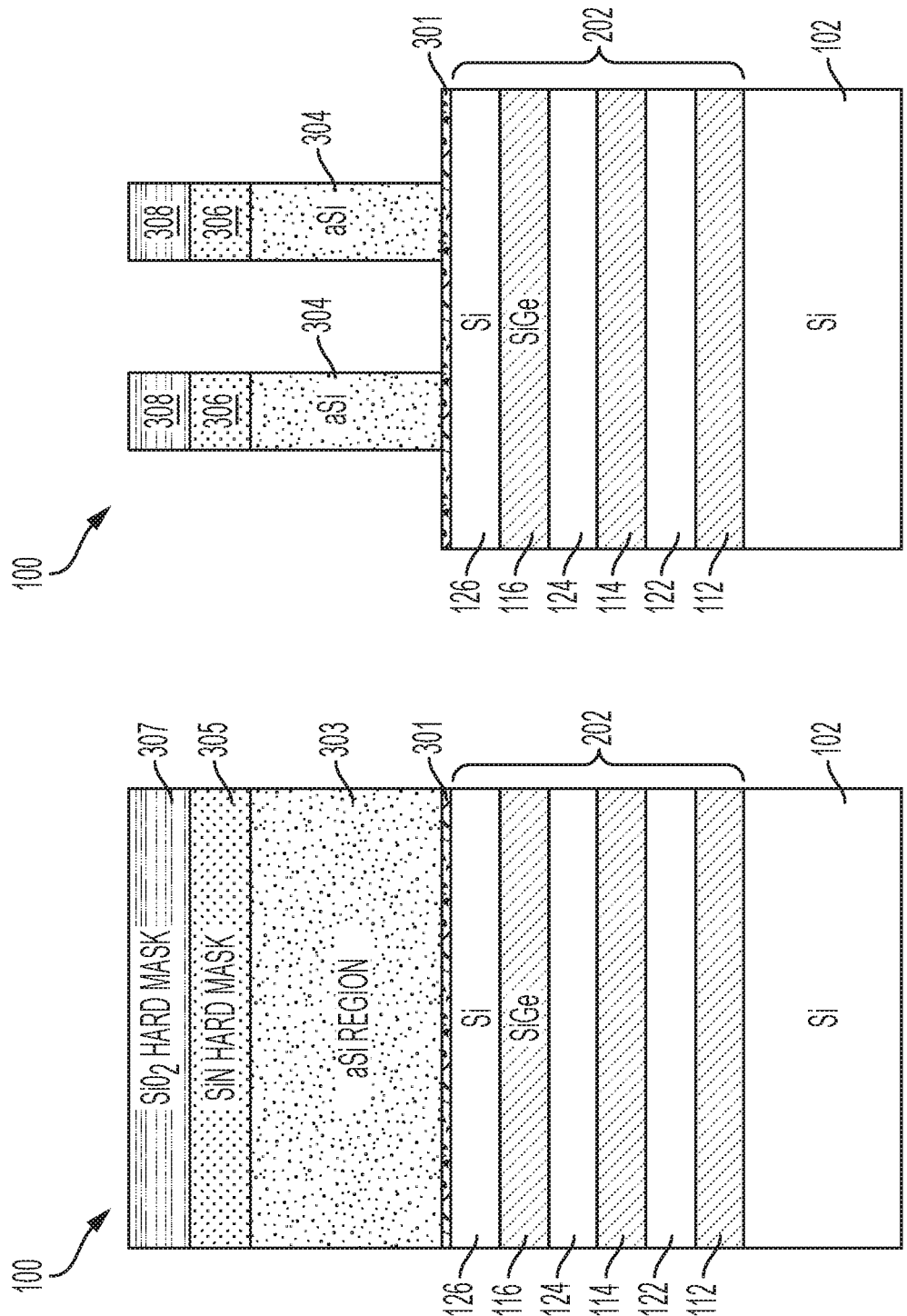

In the accompanying figures and following detailed description of the embodiments, where possible, the various elements illustrated in the figures are provided with three or four digit reference numbers. The leftmost digit(s) of each reference number corresponds to the figure in which its element is first illustrated.

DETAILED DESCRIPTION

It is understood in advance that although this invention includes a detailed description of exemplary gate-all-around (GAA) nanosheet FET architectures having silicon (Si) channel nanosheets and silicon germanium (SiGe) sacrificial nanosheets, embodiments of the invention are not limited to the particular FET architectures or materials described in this specification. Rather, embodiments of the present invention are capable of being implemented in conjunction with any other type of nanosheet/nanowire FET architecture or materials now known or later developed. In this detailed description and in the claims, the terms nanosheet and nanowire are treated as being synonymous.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

The terms "semiconductor material" and equivalents thereof are used in the present detailed description to identify a chemical element or compound that can conduct electric current under some conditions but not others. The conductance of current through a semiconductor material varies depending on the current or voltage applied to a control electrode coupled to the semiconductor material, or on the intensity of irradiation of the semiconductor material by infrared (IR) radiation, visible light, ultraviolet (UV) radiation, or X rays. The specific properties of a semiconductor material also depend on the impurities or dopants that have been added to it. An n-type semiconductor material carries current mainly in the form of negatively-charged particles in a manner similar to the conduction of current in a wire. A p-type semiconductor material carries current predominantly as electron deficiencies (or positively charge particles) called holes. A hole has a positive electric charge that is equal and opposite to the negative charge on an electron. In a semiconductor material, the flow of holes occurs in a direction opposite to the flow of electrons. Elemental semiconductor materials include antimony, arsenic, boron, carbon, germanium, selenium, silicon, sulfur, and tellurium. Common semiconductor compounds include, but are not limited to, gallium arsenide, indium antimonide, and the oxides of most metals.

The terms "non-semiconductor material" and equivalents thereof are used in the present detailed description to identify a chemical or element that does not exhibit the ability to conduct electric current under some conditions but not others. Non-semiconductor materials can have substantially no conductance, low conductance or high conductance. Examples of non-semiconductor materials include dielectric materials (e.g., nitrides, oxides, and the like), metals, and metal alloys.

Turning now to a description of technologies that are more specifically relevant to aspects of the present invention, transistors are semiconductor devices commonly found in a wide variety of ICs. A transistor is essentially a switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

Typical semiconductor devices are formed using active regions of a wafer. The active regions are defined by isolation regions used to separate and electrically isolate adjacent semiconductor devices. For example, in an IC having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer.

MOSFET-based ICs are fabricated using so-called complementary metal oxide semiconductor (CMOS) fabrication technologies. In general, CMOS is a technology that uses complementary and symmetrical pairs of p-type and n-type MOSFETs to implement logic functions. The channel region connects the source and the drain, and electrical current flows through the channel region from the source to the drain. The electrical current flow is induced in the channel region by a voltage applied at the gate electrode.

The wafer footprint of an FET is related to the electrical conductivity of the channel material. If the channel material has a relatively high conductivity, the FET can be made with a correspondingly smaller wafer footprint. A known method of increasing channel conductivity and decreasing FET size is to form the channel as a nanostructure. For example, a so-called gate-all-around (GAA) nanosheet FET is a known architecture for providing a relatively small FET footprint by forming the channel region as a series of stacked nanosheets. In a known GAA configuration, a nanosheet-based FET includes a source region, a drain region and stacked nanosheet channels between the source and drain regions. A gate surrounds the stacked nanosheet channels and regulates electron flow through the nanosheet channels between the source and drain regions.

GAA nanosheet FETs can be fabricated by forming alternating layers of channel nanosheets and sacrificial nanosheets. The sacrificial nanosheets are released from the channel nanosheets before the FET device is finalized. For n-type FETs, the channel nanosheets are typically silicon (Si) and the sacrificial nanosheets are typically silicon germanium (SiGe). For p-type FETs, the channel nanosheets can be SiGe and the sacrificial nanosheets can be Si. In some implementations, the channel nanosheet of a p-FET can be SiGe or Si, and the sacrificial nanosheets can be Si or SiGe. Forming the GAA nanosheets from alternating layers of channel nanosheets formed from a first type of semiconductor material (e.g., Si for n-type FETs, and SiGe for p-type FETs) and sacrificial nanosheets formed from a second type of semiconductor material (e.g., SiGe for n-type FETs, and Si for p-type FETs) provides superior channel electrostatics control, which is necessary for continuously scaling gate lengths down to seven (7) nanometer CMOS technology and below. The use of multi-layered SiGe/Si sacrificial/channel nanosheets (or Si/SiGe sacrificial/channel nanosheets) to form the channel regions in GAA FET semiconductor devices provides desirable device characteristics, including the introduction of strain at the interface between SiGe and Si.

Although nanosheet channel FET architectures provide increased device density over planar FET architectures, there are still challenges when attempting to fabricate nanosheet channel FETs. For example, in known nanosheet transistor fabrication processes, the channel nanosheets and the S/D regions are formed from semiconductor material. Additionally, the alternating layers of channel nanosheets and sacrificial nanosheets sacrificial nanosheets are epitaxially grown one from the other, which requires that the sacrificial nanosheets are formed from a material that is sufficiently close to the channel nanosheets that one can be epitaxially grown from the other. Accordingly, the sacrificial nanosheets need to also be formed from a semiconductor material, and in many nanosheet FET architectures the sacrificial nanosheets are formed from the same type of semiconductor material as the S/D regions. For example, in a known p-type nanosheet FET architecture, the sacrificial nanosheets and the S/D regions are both formed from SiGe, and the sacrificial nanosheets are released after the S/D regions have been formed, which means that the S/D regions can be damaged when the sacrificial nanosheets are released. Additionally, forming the nanosheet stack from alternating layers of Si/SiGe channel/sacrificial nanosheets, or from alternating layers of SiGe/Si channel/sacrificial nanosheets, means that, within the nanosheet stack, Si is in touch with SiGe, which limits the thermal budget that is available to anneal dielectric materials of the nano sheet FET such as gate sidewall spacers and sacrificial nanosheet inner spacers.

Turning now to an overview of aspects of the invention, embodiments of the invention address the above-described shortcomings of the prior art by providing fabrication methods and resulting structures for forming nanosheet transistors that include replacement sacrificial nanosheets having improved etch selectivity with respect to at least the S/D regions of the transistor. In embodiments of the invention, a nanosheet stack is formed having alternating layers of channel nanosheets and sacrificial nanosheets, wherein each of the layers of channel nanosheets includes a first type of semiconductor material, and wherein each of the layers of sacrificial nanosheets includes a second type of semiconductor material. The layers of sacrificial nanosheets are removed from the nanosheet stack, and layers of replacement sacrificial nanosheets are formed in the spaces that were occupied by the sacrificial nanosheets. Each of the layers of replacement sacrificial nanosheets includes a first type of non-semiconductor material. S/D regions are communicatively coupled to ends of the layers of channel nanosheets. An etch medium is applied, wherein the etch medium is configured to remove the layers of replacement nanosheets from the nanosheet stack. The S/D regions include the first type of semiconductor material or the second type of semiconductor material. The first type of semiconductor material has a first etch rate in response to the etch medium. The second type of semiconductor material has a second etch rate in response to the etch medium. The first type of non-semiconductor material has a third etch rate in response to the etch medium. The third etch rate is greater than the second etch rate, and the third etch rate is greater than the first etch rate.

In some embodiments of the invention, prior to removing the layers of sacrificial nanosheets from the nanosheet stack, sidewall gate spacers are formed over and around the nanosheet stack, and, subsequent to forming the layers of replacement sacrificial nanosheets in spaces that were occupied by the sacrificial nanosheets, inner spacers are formed adjacent to ends of each of the layers of replacement sacrificial nanosheets. Each of the gate sidewalls includes a second type of non-semiconductor material, and each of the inner spacers includes a third type of non-semiconductor material. The second type of non-semiconductor material has a fourth etch rate in response to the etch medium, and the third type of non-semiconductor material has a fifth etch rate in response to the etch medium. The third etch rate is greater than the fourth etch rate, and the third etch rate is greater than the fifth etch rate.

In some embodiments of the invention, the first type of semiconductor material can be any suitable semiconductor material for use in nanosheet FETs architectures, including, but not limited to Si and SiGe. The second type of semiconductor material can be any suitable semiconductor material for use in nanosheet FETs architectures, including, but not limited to Si and SiGe. The first type of non-semiconductor material can be any suitable non-semiconductor material, including, but not limited to an oxide, a nitride, and a metal. The second type of non-semiconductor material can be any suitable non-semiconductor material, including, but not limited to an oxide and a nitride. The third of non-semiconductor material can be any suitable non-semiconductor material, including, but not limited to an oxide and a nitride.

In embodiments of the invention, the etch medium is selected to have a higher etch rate when applied to the first type of non-semiconductor material (e.g., the replacement sacrificial nanosheets) than its etch rate when applied to any one of the first type of semiconductor material (e.g., the channel nanosheets or the sacrificial nanosheets), the second type of semiconductor material (e.g., the channel nanosheets or the sacrificial nanosheets), the second type of non-semiconductor material (e.g., the gate sidewall spacers), and the third type of non-semiconductor material (e.g., the inner spacers). In embodiments of the invention where the first type of semiconductor material is an oxide, the etch medium can be any suitable etch medium having an etch rate of the type described above, including, but not limited to dHF or BHF. In embodiments of the invention where the first type of semiconductor material is a nitride, the etch medium can be any suitable etch medium having an etch rate of the type described above, including, but not limited to phosphoric acid. In embodiments of the invention where the first type of semiconductor material is a metal, the etch medium can be any suitable etch medium having an etch rate of the type described above. For example, if the metal is TiN, a suitable etch medium includes but is not limited to hydrogen peroxide or RCA-1.

Turning now to a more detailed description of fabrication operations according to aspects of the invention, FIGS. 1-14 depict cross-sectional views of a section 100 of a substrate/wafer 102 after various fabrication operations to form nanosheet transistors 140, 140A (shown in FIG. 14) thereon, wherein fabrication of the nanosheet transistor 140, 140A include the use of replacement sacrificial nanosheets having improved etch selectivity in accordance with aspects of the invention. For ease of illustration and description, two nanosheet transistors 140, 140A are shown on the substrate 102. However, it should be understood that the teachings in this detailed description can be applied to the fabrication of a substrate/wafer having any number of nanosheet transistors formed thereon. The nanosheet transistors 140, 140A are substantially identical, and so reference numbers for elements of one of the nanosheet transistors 140, 140A applies equally to the corresponding element on the other nanosheet transistor.

As shown in FIG. 1, after initial fabrication stages, an alternating series of SiGe sacrificial nanosheet layers 112, 114, 116 and Si nanosheet layers 122, 124, 126 have been formed in a stack over a bottom insulating layer 130 and over a silicon (Si) substrate 102. In the illustrated embodiments, the substrate 102 includes a bulk silicon material. Alternatively, the substrate 102 can be implemented in a semiconductor-on-insulator (SOI) configuration. In some embodiments of the invention, the SiGe nanosheet layers 112, 114, 116 can be within a range from SiGe 20% to SiGe 40%. The notations "SiGe 20%" and "SiGe 40%" are used to indicate that about 20% of the SiGe material is Ge and about 80% of the SiGe material is Si, or that about 40% of the SiGe material is Ge and about 60% of the SiGe material is Si, respectively.

With reference to the x/y/z diagrams depicted in FIGS. 1, 2A, and 2B, the various elements depicted in FIGS. 1-14 extend along a first axis (e.g., x-axis) to define width dimensions, and extend along a second axis (e.g., y-axis) perpendicular to the x-axis to define height dimensions. Although not specifically depicted in the two-dimensional (2D) cross-sectional views shown in FIGS. 1-14, the various elements depicted also extend along a third axis (e.g., z-axis) perpendicular to the first axis and the second axis to define depth dimensions. In accordance with standard GAA nanosheet transistors architectures, various elements of the depicted fabrication stages extend completely around other elements in the x-axis, y-axis, and z-axis directions.

In embodiments of the invention, the alternating nanosheet layers 112, 122, 114, 124, 116, 126 depicted in FIG. 1 can be formed by epitaxially growing one layer and then the next until the desired number and desired thicknesses of the nanosheet layers 112, 122, 114, 124, 116, 126 are achieved. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surfaces, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial silicon layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

FIG. 2A depicts a cross-sectional, across-the-fin view of the section/portion 100 of the substrate 102 after fabrication stages according to embodiments of the invention. FIG. 2B depicts a cross-sectional, across-the-gate view of the section/portion 100 of the substrate 102 shown in FIG. 2A, wherein the across-the-gate view results from rotating the across-the-fin view 90 degrees counterclockwise into the page. In FIGS. 2A and 2B, known semiconductor fabrication operations have been used to etch or recess the alternating nanosheet layers 112, 122, 114, 124, 116, 126 shown in FIG. 1 to form multiple intermediate elongated columns 202. In an example fabrication process, a patterned hard mask (not shown) is deposited over the alternating nanosheet layers 112, 122, 114, 124, 116, 126. The pattern of the hard mask defines the footprints of the multiple intermediate elongated columns 202 shown in FIGS. 2A and 2B. FIG. 2A is a view of the intermediate elongated columns 202 by a person standing in front the narrowest sidewalls of the intermediate elongated columns 202 (i.e., in the across-fin direction). FIG. 2B is a view of one of the intermediate elongated columns 202 by a person standing in front of the elongated sidewall of one of the intermediate elongated columns 202 (i.e., in the across-gate direction). An etch (e.g., an RIE) or a recess is applied to remove the portions of the alternating nanosheet layers 112, 122, 114, 124, 116, 126 that are not covered by the patterned hard mask, thereby forming the intermediate elongated columns 202.

The remaining FIGS. 3-14 are the cross-sectional, across-the-gate view used in FIG. 2B. In FIG. 3, known semiconductor fabrication operations have been used to form an amorphous silicon (a-Si) region 303, a bottom hard mask layer 305, and a top hard mask layer 307, configured and arranged as shown. Top and bottom hard mask 307, 305 can be, but are not limited to, SiN and $SiO_2$, both of which can contain C, B, N for patterning gates. Although only one of the intermediate elongated fin-shaped columns 202 is shown in the two-dimensional (x-axis and y-axis) cross-sectional diagram shown in FIG. 3, multiple additional intermediate elongated fin-shaped columns (not shown) are positioned behind the intermediate elongated fin-shaped column 202 and extend into the page in the z-axis direction. The additional intermediate elongated fin-shaped columns positioned behind the intermediate elongated fin-shaped column 202 are substantially the same as the intermediate elongated fin-shaped column 202. Similarly, although the a-Si region 303 is depicted in a cross-sectional, 2D view in FIG. 3, in practice, the aSi region 303 is formed over and around the elongated sidewalls of each of the intermediate elongated fin-shaped columns 202 in the z-axis direction.

In FIG. 4, known semiconductor fabrication operations have been used to form the dummy gates 304. For example, the dummy gates 304 can be formed by patterning the bottom hard mask layer 305 (shown in FIG. 3) and the top hard mask layer 307 (shown in FIG. 3) to form the hard masks 306, 308. An etching process (e.g., an RIE) is applied to the a-Si region 303 (shown in FIG. 3) to form the dummy gates 304.

In FIG. 5, known semiconductor fabrication operations have been used to remove the SiGe sacrificial nanosheets 112, 114, 116. In embodiments of the invention, the SiGe sacrificial nanosheets 112, 114, 116 can be removed by applying a selective etch (e.g., a hydrochloric acid (HCl)).

In FIG. 6, known semiconductor fabrication operations have been used to conformally deposit dummy gate sidewall spacers 602, and replacement sacrificial nanosheets 612, 614, 616 have been formed in the spaces that were occupied by the SiGe sacrificial nanosheets 112, 114, 116 (shown in FIG. 5). By conformally depositing the dummy gate sidewall spacers 602, the material of the dummy gate sidewall spacers will also pinch off in the spaces that that were occupied by the SiGe sacrificial nanosheets 112, 114, 116, thereby forming the replacement sacrificial nanosheets 612, 614, 616. The dummy gate sidewall spacers 602 can be formed using any suitable conformal deposition process (e.g., ALD, CVD, and the like). The dummy gate sidewall spacers 602 can be any suitable dielectric material (e.g., silicon oxide, silicon nitride, silicon oxynitride, SiBCN, SiOCN, SiOC, or any suitable combination of those materials) deposited to a thickness a1. In embodiments of the invention, the dummy sidewall gate spacers 602 are utilized to, in effect, "bookmark" or "reserve" the place for the offset gate spacers 902 (shown in FIG. 9). In downstream fabrication operations, the dummy spacers 602 are replaced with the gate sidewall spacers 902. In accordance with aspects of the invention, the replacement sacrificial nanosheets 612, 614, 616 can be formed from any non-semiconductor material, including but not limited to an oxide, a nitride, a metal, a metal allow, and the like. In accordance with aspects of the invention, the replacement sacrificial nanosheets 612, 614, 616 can be formed from any non-semiconductor material having an etch rate in response to an etch medium that is sufficiently different from an etch rate of selected semiconductor material(s) in response to the etch medium that the replacement sacrificial nanosheets 612, 614, 616 can be selectively etched with respect to the selected semiconductor material(s). In accordance with aspects of the invention, the replacement sacrificial nanosheets 612, 614, 616 can be formed from any first type of non-semiconductor material having an etch rate in response to an etch medium that is sufficiently different from an etch rate of selected semiconductor material(s) in response to the etch medium, and that is sufficiently different from an etch rate of a second type of non-semiconductor material to the etch medium, that the replacement sacrificial nanosheets 612, 614, 616 can be selectively etched with respect to the selected semiconductor material(s) and the second type of non-semiconductor material.

In FIG. 7, known fabrication operations have been used to apply a directional etch (e.g., RIE) to the exposed surfaces of the gate dielectric 302 (shown in FIG. 6) and the intermediate elongated columns 202 (shown in FIG. 6) to form the gate dielectric 302A and two adjacent sets of the final fin-shaped columns 202A. Each of the fin-shaped columns 202A includes a stack of alternating Si nanosheet regions 122A, 124A, 126A and replacement sacrificial nanosheet regions 612A, 614A, 616A.

In FIG. 8, known semiconductor fabrication processes have been used to remove the dummy gate sidewall spacers 602. Known semiconductor fabrication processes have also been used to form pull back end region cavities 802 in the replacement sacrificial nanosheet regions 614A, 616A, 618A (shown in FIG. 7) from underneath the dummy sidewall gate spacers 602 using, for example, any suitable etch medium that etches non-semiconductor material without attacking Si. In other words, the etch rate of the non-semiconductor material of the replacement sacrificial regions 612A, 622A, 624A in response to the etch medium is significantly higher (e.g., 10x) than the etch rate of the Si nanosheet regions 122A, 124A, 126A in response to the etch medium. In embodiments of the invention, suitable etch mediums include, but are not limited to, BHF or dHF for silicon oxide. The end region cavities 802 are formed to thicknesses that substantially match the desired thickness of the to-be-formed inner spacers 902C (shown in FIG. 10). After formation of the end region cavities 802 in the replacement sacrificial nanosheet regions 612A, 614A, 616A, the replacement nanosheet central regions 612B, 614B, 616B remain.

Figure 9:
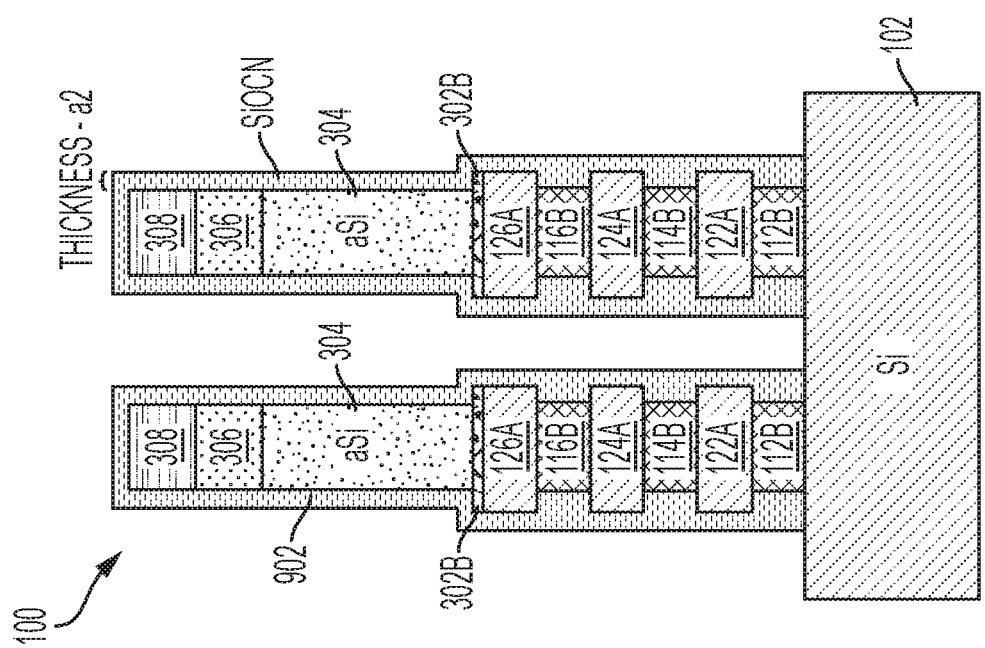

In FIG. 9, known semiconductor fabrication processes have been used to deposit a dielectric layer 902 formed from any suitable dielectric (e.g., SiOCN). In embodiments of the invention, the dielectric layer 902 extends along sidewalls of the dummy gate 304 to form the offset gate spacers 902, and also fills in the pull back end region cavities 802 (shown in FIG. 8). In embodiments of the invention, the dielectric layer 902 is formed to a thickness a2. In embodiments of the invention, a2 is substantially equal to or slightly smaller than a1, wherein a1 is the thickness of the dummy sidewall gate spacers 602 (shown in FIG. 7) that were utilized to, in effect, "bookmark" or "reserve" the place for the offset gate spacers 902 (best shown in FIG. 10). Expressed as a percentage, a2 qualifies as being slightly smaller than a1 if a2 is less than a1 and within about 20 percent of a1.

Figure 10:
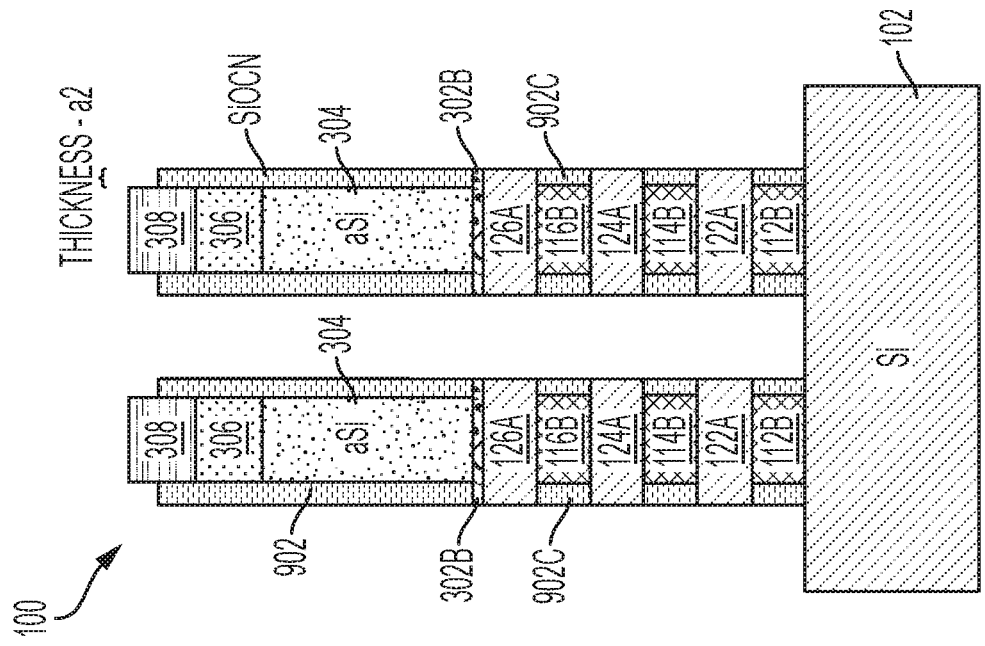

In FIG. 10, known semiconductor fabrication processes (e.g., RIE using a $CH_3F$ etch) have been used to directionally etch the dielectric layer 902, thereby exposing end sidewalls of the Si nanosheet regions 122A, 124A, 126A and resulting in the formation of the offset gate spacers 902 and inner spacers 902C. The thickness of the inner spacers 902C IS determined by the thicknesses of the end region cavities 802 (shown in FIG. 8).

Figure 11:
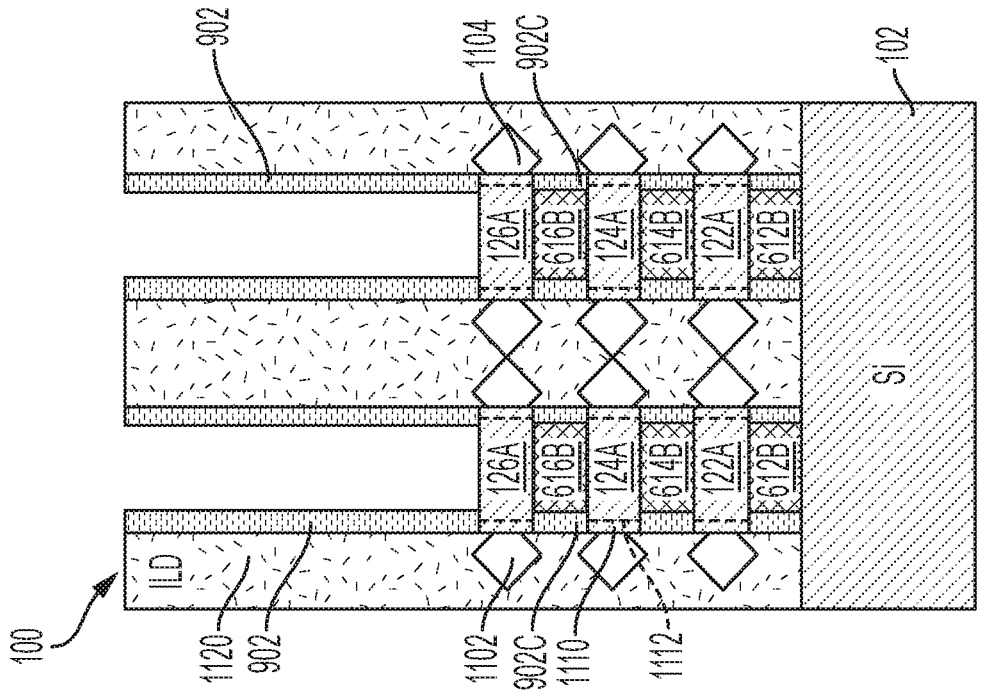

In FIG. 11, known semiconductor device fabrication processes have been used to form source/drain (S/D) regions 1102, 1104. In embodiments of the invention, the S/D regions 1102, 1114 are formed using an epitaxial layer growth process on the exposed sidewalls of the Si channel nanosheet regions 122A, 124A, 126A. In-situ doping (ISD) can be applied to form doped S/D regions 1102, 1104, thereby creating the necessary junctions in the nanosheet transistors 140, 140A (shown in FIG. 14). Virtually all semiconductor transistors are based on the formation of junctions. Junctions are capable of both blocking current and allowing it to flow, depending on an applied bias. Junctions are typically formed by placing two semiconductor regions with opposite polarities into contact with one another. The most common junction is the p-n junction, which consists of a contact between a p-type piece of silicon, rich in holes, and an n-type piece of silicon, rich in electrons. N-type and p-type FETs are formed by implanting different types of dopants to selected regions of the device to form the necessary junction(s). N-type devices can be formed by implanting arsenic (As) or phosphorous (P), and p-type devices can be formed by implanting boron (B).

In embodiments of the invention, the epitaxial growth and in-situ doping used to form the S/D regions 1102, 1104 are controlled in a manner that forms extension regions 1110 having extension junctions 1112 within the Si channel nanosheet regions 122A, 124A, 126A. For ease of illustration, only one example of the extension regions 1110 and extension junctions 1112 are provided with reference numbers. Extension regions 1110 and extension junctions 1112 extend under the offset gate spacers 902, and the regions of the Si channel nanosheets 122A, 124A, 126A under the gate dummy gates 304 remain undoped. In embodiments of the invention, the doping of extension regions 1110 can be performed by implanting the end regions of the Si channel nanosheet regions 122A, 124A, 126A with ions (or dopants) (e.g., through epitaxy or through ion implantation). Extension junctions 1110 reduce the $R_{ext}$ of the nanosheet transistors 140, 140A (shown in FIG. 14) when they are turned on by applying the appropriate gate bias voltages. The extension junctions 1110 also form a conducting path between the S/D regions 1101, 1104 and the Si channel nanosheet regions 122A, 124A, 126A. In order to optimize transistor performance, the extension junctions 1112 can be positioned such that they terminate in substantially the same plane that the final metal gate structure 1406 (shown in FIG. 14) and/or the final work function metal (WFM) gate structure 1404 (shown in FIG. 14) begin.

Referring still to FIG. 11, known semiconductor fabrication operations have been used to form an interlayer dielectric (ILD) region 1120. The ILD region 1120 can be formed by depositing an oxide material in bulk (e.g., silicon dioxide) and polishing the bulk oxide back (e.g., using CMP) to the level of the hard masks 306.

Figure 12:
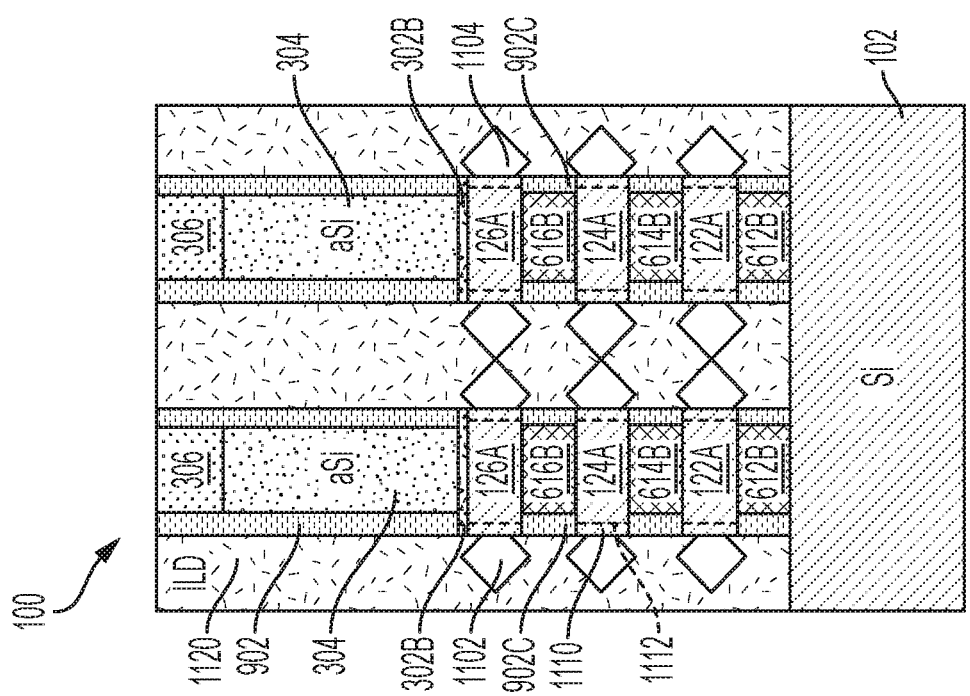

In FIG. 12, known semiconductor fabrication operations have been used to remove the gate dielectric 302B, the dummy gates 304, and the hard masks 306. In embodiments of the invention, the gate dielectric 302B, the dummy gates 304 and the hard masks 306 can be removed by a known etching process, e.g., RIE or chemical oxide removal (COR).

In FIG. 13, known semiconductor fabrication operations have been used to remove the replacement sacrificial nanosheet central regions 612B, 614B, 616B (shown in FIG. 12), which have been formed from a first type of non-semiconductor material. In embodiments of the invention, the replacement sacrificial nanosheet central regions 612B, 614B, 616B are removed from the Si nanosheet regions 122A, 124A, 126A by applying an etch medium. The etch medium can be any suitable etch medium that etches non-semiconductor material (e.g., a nitride, an oxide, a metal, a metal alloy, etc.) at a faster rate (e.g., 10x) than it etches semiconductor material (e.g., Si, SiGe, etc.). In embodiments of the invention, the etch medium can also be any suitable etch medium that etches a first type of non-semiconductor material (e.g., a nitride, an oxide, a metal, a metal alloy, etc.) at a faster rate (e.g., 10x) than it etches a second type of non-semiconductor material (e.g., a nitride, an oxide, a metal, a metal alloy, etc.) and a semiconductor material (e.g., Si, SiGe, etc.).

In FIG. 14, known semiconductor fabrication processes (e.g., a gate-late fabrication process) have been used to replace the removed dummy gates 304, hard masks 306, 308, gate dielectric 302B, and replacement sacrificial nanosheets 612B, 614B, 616B with a multi-segmented metal gate structure 1404, 1406 and a relatively thin (e.g., from about 1 nm to about 5 nm) gate dielectric (e.g., high-k (HK)) layer 1402. In embodiments of the invention, the relatively thin gate dielectric layer 1402 can be formed from a hafnium-based material. In embodiments of the invention, the gate metal structure 1404 can include a metal liner, e.g., a WFM 1404. In embodiments of the invention, the WFM 1404 can be, for example, TiN or TaN. In embodiments of the invention, the metal gate structure 1406 can be a metal gate formed from, e.g., aluminum or tungsten. The multi-segmented metal gate structure 1404, 1406 and the relatively thin gate dielectric layer 1402 surround the stacked Si nanosheet channel regions 122A, 124A, 126A and regulate electron flow through the Si nanosheet channel regions 122A, 124A, 126A between the S/D regions 1102, 1104.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the detailed description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/ connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," "slightly less than," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and IC fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming a nanosheet transistor, the method comprising:
   forming a nanosheet stack comprising alternating layers of channel nanosheets and sacrificial nanosheets;
   wherein each of the layers of channel nanosheets comprises a first type of semiconductor material;
   wherein each of the layers of sacrificial nanosheets comprises a second type of semiconductor material;
   removing the layers of sacrificial nanosheets from the nanosheet stack;
   forming layers of replacement sacrificial nanosheets in spaces that were occupied by the sacrificial nanosheets;
   wherein each of the layers of replacement sacrificial nanosheets comprises a first type of non-semiconductor material; and
   removing the layers of replacement sacrificial nano sheets.

2. The method of claim 1, wherein:
   the first type of semiconductor material has a first etch rate in response to an etch medium; and
   the second type of semiconductor material has a second etch rate in response to the etch medium.

3. The method of claim 2, wherein the first type of non-semiconductor material has a third etch rate in response to the etch medium.

4. The method of claim 3, wherein the third etch rate is greater than the second etch rate.

5. The method of claim 4, wherein the third etch rate is greater than the first etch rate.

6. The method of claim 1, wherein the first type of non-semiconductor material comprises a dielectric.

7. The method of claim 6, wherein the dielectric is selected from a group consisting of an oxide and a nitride.

8. The method of claim 1, wherein the first type of non-semiconductor material comprises a metal.

9. A method of forming a nanosheet transistor, the method comprising:
   forming a nanosheet stack comprising alternating layers of channel nanosheets and sacrificial nanosheets;
   wherein each of the layers of channel nanosheets comprises a first type of semiconductor material;
   wherein each of the layers of sacrificial nanosheets comprises a second type of semiconductor material;
   removing the layers of sacrificial nanosheets from the nanosheet stack;
   forming layers of replacement sacrificial nanosheets in spaces that were occupied by the sacrificial nanosheets;
   wherein each of the layers of replacement sacrificial nanosheets comprises a first type of non-semiconductor material;
   forming source or drain (S/D) regions communicatively coupled at ends of the layers of channel nanosheets; and
   applying an etch medium configured to remove the layers of replacement nanosheets from the nanosheet stack;
   wherein the S/D regions comprise the first type of semiconductor material or the second type of semiconductor material;
   wherein the first type of semiconductor material has a first etch rate in response to the etch medium;
   wherein the second type of semiconductor material has a second etch rate in response to the etch medium;
   wherein the first type of non-semiconductor material has a third etch rate in response to the etch medium;
   wherein the third etch rate is greater than the second etch rate; and
   wherein the third etch rate is greater than the first etch rate.

10. The method of claim 9 further comprising:
    prior to removing the layers of sacrificial nanosheets from the nanosheet stack, forming sidewall gate spacers over and around the nanosheet stack; and
    subsequent to forming the layers of replacement sacrificial nanosheets in spaces that were occupied by the sacrificial nanosheets, forming inner spacers adjacent to ends of each of the layers of replacement sacrificial nanosheets;
    wherein each of the gate sidewalls comprises a second type of non-semiconductor material;
    wherein each of the inner spacers comprises a third type of non-semiconductor material;
    wherein the second type of non-semiconductor material has a fourth etch rate in response to the etch medium;
    wherein the third type of non-semiconductor material has a fifth etch rate in response to the etch medium;
    wherein the third etch rate is greater than the fourth etch rate; and
    wherein the third etch rate is greater than the fifth etch rate.

11. The method of claim 10, wherein:
    the first type of semiconductor material is selected from a group consisting of Si and SiGe;

the second type of semiconductor material is selected from the group consisting of Si and SiGe;

the first type of non-semiconductor material is selected from a group consisting of an oxide, a nitride, and a metal;

the second type of non-semiconductor material is selected from a group consisting of an oxide and a nitride; and the third of non-semiconductor material is selected from the group consisting of an oxide and a nitride.

12. A method of forming a nanosheet transistor, the method comprising:

forming a nanosheet stack comprising alternating layers of channel nanosheets and sacrificial nanosheets;

wherein each of the layers of channel nanosheets comprises a first type of semiconductor material;

wherein each of the layers of sacrificial nanosheets comprises a second type of semiconductor material;

forming gate sidewall spacers over and around the nanosheet stack;

removing the layers of sacrificial nanosheets from the nanosheet stack;

forming layers of replacement sacrificial nanosheets in spaces that were occupied by the sacrificial nanosheets; and forming inner spacers adjacent to ends of each of the layers of replacement sacrificial nanosheets;

wherein each of the layers of replacement sacrificial nanosheets comprises a first type of non-semiconductor material;

wherein each of the gate sidewalls comprises a second type of non-semiconductor material;

wherein each of the inner spacers comprises a third type of non-semiconductor material; and replacing the layers of replacement sacrificial nanosheets with conductive gate regions.

13. The method of claim 12, wherein:

the first type of semiconductor material has a first etch rate in response to an etch medium; and the second type of semiconductor material has a second etch rate in response to the etch medium.

14. The method of claim 13, wherein the first type of non-semiconductor material has a third etch rate in response to the etch medium.

15. The method of claim 14, wherein the third etch rate is greater than the second etch rate.

16. The method of claim 15, wherein the third etch rate is greater than the first etch rate.

17. The method of claim 16, wherein:

the second type of non-semiconductor material has a fourth etch rate in response to the etch medium; and the third etch rate is greater than the fourth etch rate.

18. The method of claim 17, wherein:

the third type of non-semiconductor material has a fifth etch rate in response to the etch medium; and the third etch rate is greater than the fifth etch rate.

19. The method of claim 13, wherein:

the first type of non-semiconductor material comprises a first type of dielectric;

the second type of non-semiconductor material comprises a second type of dielectric; and the third type of non-semiconductor material comprises a third type of dielectric.

20. The method of claim 19, wherein:

the first type of dielectric is selected from a group consisting of an oxide, a nitride, and a metal;

the second type of dielectric is selected from a group consisting of an oxide and a nitride;

the third type of dielectric is selected from the group consisting of an oxide and a nitride.

* * * * *